US009113554B2

(12) United States Patent
Qin et al.

(10) Patent No.: US 9,113,554 B2
(45) Date of Patent: *Aug. 18, 2015

(54) MICROPHONICS SUPPRESSION IN HIGH-SPEED COMMUNICATIONS SYSTEMS

(71) Applicant: Aviat U.S., Inc., Santa Clara, CA (US)

(72) Inventors: Youming Qin, Sunnyvale, CA (US); Frank S. Matsumoto, San Ramon, CA (US); Eric Tiongson, Daly City, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/158,422

(22) Filed: Jan. 17, 2014

(65) Prior Publication Data
US 2014/0198472 A1 Jul. 17, 2014

Related U.S. Application Data

(63) Continuation of application No. 12/795,438, filed on Jun. 7, 2010, now Pat. No. 8,644,028, which is a continuation of application No. 11/560,453, filed on Nov. 16, 2006, now Pat. No. 7,733,667.

(51) Int. Cl.
H05K 5/00 (2006.01)
H05K 5/02 (2006.01)
(Continued)

(52) U.S. Cl.
CPC .............. H05K 5/0217 (2013.01); H05K 7/142 (2013.01); H05K 13/00 (2013.01); Y10T 29/49002 (2015.01)

(58) Field of Classification Search
USPC ......... 361/800, 807, 809, 810, 816, 818, 742; 361/770, 804; 174/138 E, 138 G
See application file for complete search history.

(56) References Cited

U.S. PATENT DOCUMENTS 4,067,531 A    1/1978  Sikula
4,091,232 A    5/1978  Lenk et al.
(Continued)

FOREIGN PATENT DOCUMENTS

EP    0766418    4/1997
EP    1469555    10/2004

OTHER PUBLICATIONS

Acoustical Solutions, Inc., "Technical Data Sheet: Soundamp E Asphalt Based Vibration Damping Sheets," www.acousticalsolutions.com, 1 page, 2003.
(Continued)

Primary Examiner — Hung S Bui
(74) Attorney, Agent, or Firm — Sheppard, Mullin, Richter & Hampton LLP

(57) ABSTRACT

One design aspect in electronic systems, such as communication systems, is noise suppression. More particularly, this relates to microphonics suppression in high-speed communication systems, such as microwave wireless radio systems. The present invention contemplates system design for substantially eliminating microphonic behavior created by mechanical stimulus such as vibrations and the drum effect. A preferred approach includes isolating the motherboard from its mounting harnesses (mechanical interconnection) and adding an echo damping and shock absorption pad to the underside of the enclosure cover to stiffen the enclosure cover while maintaining its light weight. Preferably also, this approach isolates the entire motherboard rather than a particular component. A design using this approach is particularly useful in an outdoor unit (ODU) of a split-mount microwave radio system.

20 Claims, 7 Drawing Sheets

(51) Int. Cl.
*H05K 7/14* (2006.01)
*H05K 13/00* (2006.01)

(56) References Cited

U.S. PATENT DOCUMENTS

| | | | |
|---|---|---|---|
| 4,306,708 A | 12/1981 | Gassaway et al. | |
| 4,358,098 A | 11/1982 | Ceseri | |
| 4,642,735 A | 2/1987 | Hodsdon et al. | |
| 4,647,245 A | 3/1987 | Konsevich et al. | |
| 4,831,211 A | 5/1989 | McPherson et al. | |
| 4,871,142 A | 10/1989 | DeMey, II | |
| 4,875,140 A | 10/1989 | Delpech et al. | |
| 5,008,777 A | 4/1991 | Burns | |
| 5,044,338 A | 9/1991 | Shelton | |
| 5,294,749 A | 3/1994 | Lauder et al. | |
| 5,491,892 A | 2/1996 | Fritz et al. | |
| 5,550,712 A | 8/1996 | Crockett | |
| 5,566,047 A | 10/1996 | Kahn et al. | |
| 5,713,690 A | 2/1998 | Corbin et al. | |
| 5,812,374 A | 9/1998 | Shuff | |
| 5,959,642 A | 9/1999 | Fujioka et al. | |
| 6,243,274 B1 | 6/2001 | Willis | |
| 6,354,578 B1 | 3/2002 | Nakatsukasa et al. | |
| 6,561,312 B2 | 5/2003 | Stanienda et al. | |
| 6,754,085 B2 | 6/2004 | Kalkbrenner | |
| 6,778,400 B2 | 8/2004 | Kurle et al. | |
| 6,809,916 B2 | 10/2004 | Nakata et al. | |
| 6,842,343 B2 | 1/2005 | Lee | |
| 6,906,266 B2 | 6/2005 | Verrigni | |
| 6,923,691 B2 | 8/2005 | Ireland | |
| 7,073,624 B2 | 7/2006 | Decanio et al. | |
| 7,349,222 B2 | 3/2008 | Kim | |
| 7,643,243 B2 | 1/2010 | Lee et al. | |
| 8,116,101 B2 | 2/2012 | Chang et al. | |
| 8,432,698 B2 | 4/2013 | Liu | |
| 8,644,028 B2 * | 2/2014 | Qin et al. | 361/758 |
| 2004/0203528 A1 | 10/2004 | Ammar et al. | |
| 2006/0098332 A1 | 5/2006 | Lee et al. | |
| 2010/0165578 A1 | 7/2010 | Kearns | |

OTHER PUBLICATIONS

Carcagno, R. et al., "Microphonics Detuning Compensation in 3.9 GHz Superconducting RF Cavities," 11th Workshop on RF-Superconductivity SRF-2003, FERMILAB-Conf-03/315-E, 4 pages, Oct. 2003.

E-A-R Specialty Composites, "Products: Molding Materials," www.earsc.com, 3 pages, 2004.

Tektronix, Inc., "Capturing and Measuring Microphonics and Phase-Hits with the RTSA," www.tektronix.com/RSA, 20 pages, 2005.

European Patent Application No. 07868721.7, Extended European Search Report mailed Dec. 13, 2010.

International Application No. PCT/US2007/084349, International Search Report and Written Opinion mailed Sep. 23, 2008.

Singapore Patent Application Serial No. 200903367-1, Office Action mailed May 27, 2010.

U.S. Appl. No. 11/560,453, Notice of Allowance mailed Jan. 26, 2010.

U.S. Appl. No. 11/560,453, Office Action mailed Jun. 18, 2009.

* cited by examiner

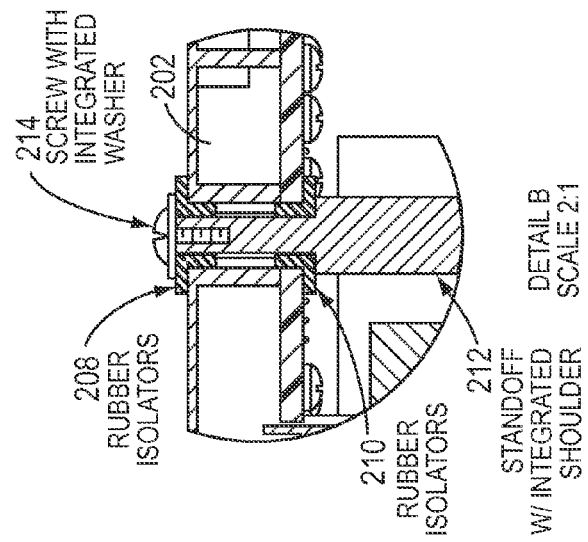
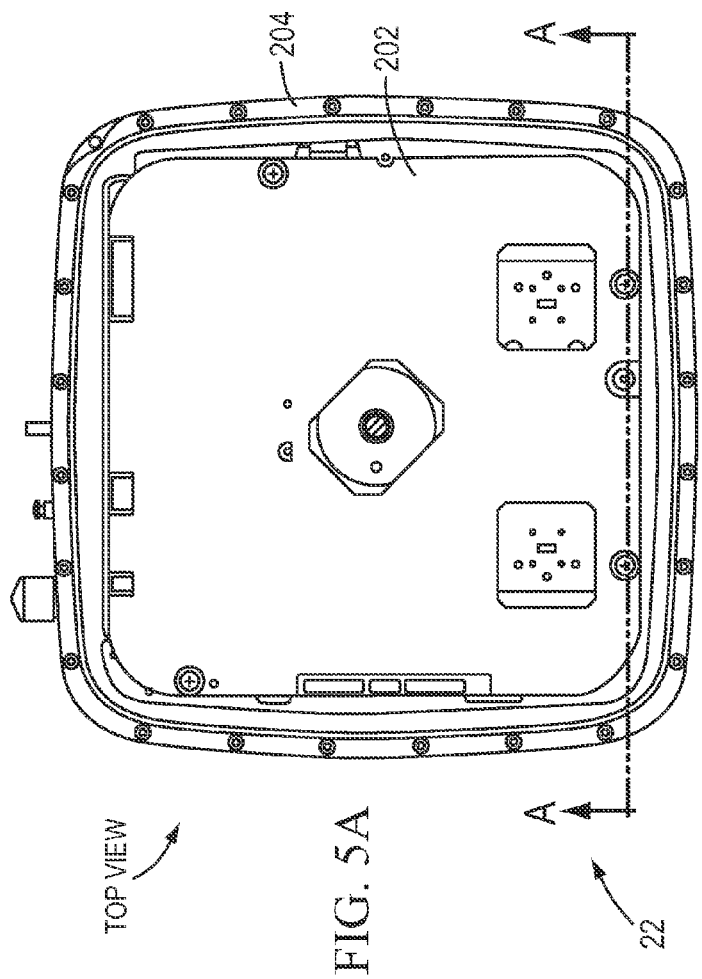
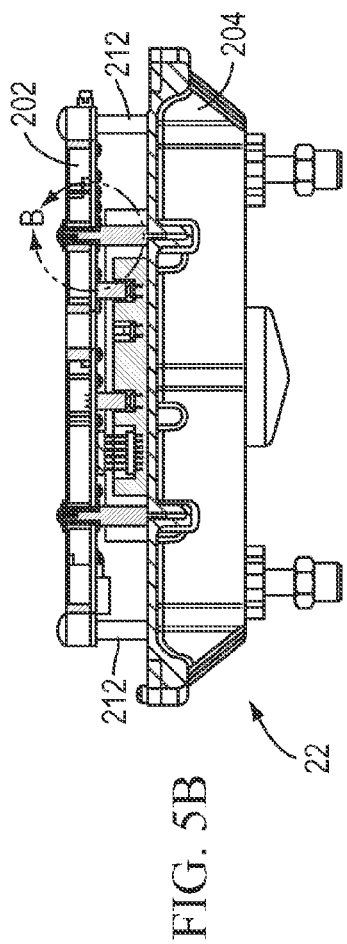

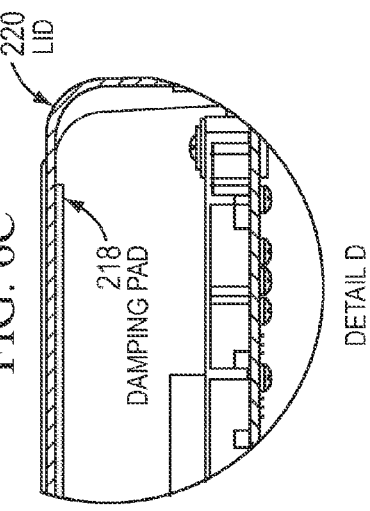
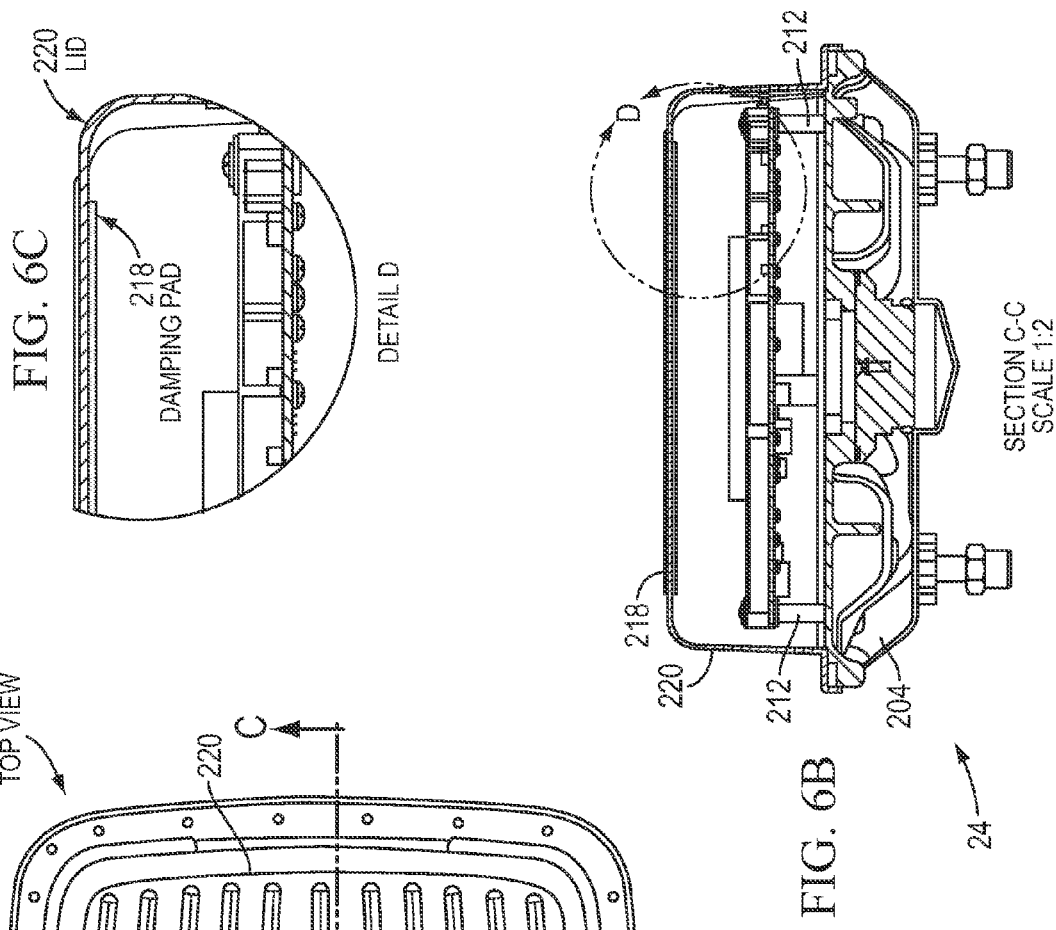
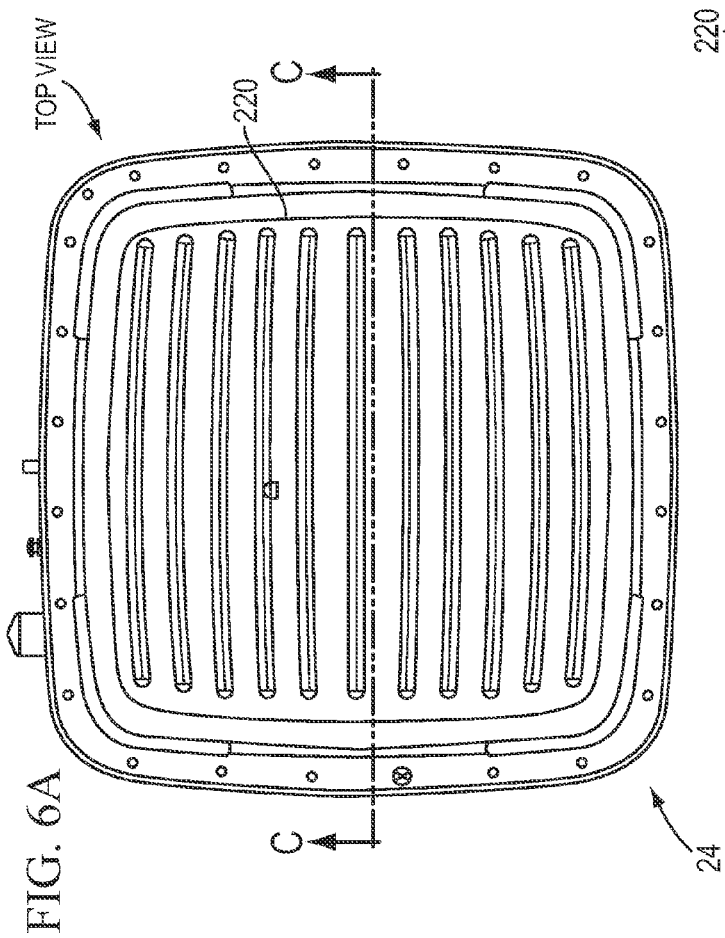

MICROPHONICS SUPPRESSION IN HIGH-SPEED COMMUNICATIONS SYSTEMS

CROSS-REFERENCE TO RELATED APPLICATIONS

The present application is a continuation of and claims priority to U.S. patent application Ser. No. 12/795,438, filed Jun. 7, 2010 and entitled "Microphonics Suppression in High-Speed Communications Systems," now issued as U.S. Pat. No. 8,644,028, which is a continuation of U.S. patent application Ser. No. 11/560,453, filed Nov. 16, 2006, entitled "Microphonics Suppression in High-Speed Communications Systems," now issued as U.S. Pat. No. 7,733,667, each of which is incorporated by reference herein.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

This invention relates to noise suppression in communication systems and more particularly to microphonics suppression in high-speed communication systems, such as microwave wireless radio systems.

BACKGROUND

Microphonic behavior is an electrical response induced by acceleration that comes from mechanical stimulus. Various physical phenomena, such as vibrations, pounding and acoustic pressure, can create the mechanical stimulus from which Microphonic behavior comes. In electronic equipment, mechanical vibrations, or mechanical modulations, can come from a very high speeds movement, exposure to sound pressure waves or exposure to the elements such as heavy rain or hailstones. For example, when hailstones pound the cover of an enclosed system the cover vibrates if it is thin and flexible, and it may also produce sound pressure waves because of the drum effect. These sound pressure waves are conducted through the air in the cavity of the enclosure and create mechanical vibrations.

When in a high vibrations environment, electronic components tend to exhibit microphonic behavior by transforming the mechanical vibrations into an electrical signal. This transducer-like behavior introduces the electrical signal into the electronic equipment as undesirable noise.

In communication systems, the undesirable noise can disrupt the communication medium and result in bit errors or synchronization loss. Loss of synchronization causes large burst of data errors. This means that for a short period of time, the communication may be totally lost until the system is resynchronized. For a high quality communication link, large bursts of data errors are unacceptable.

Microwave components are often more susceptible to microphonic behavior. When the mechanical vibrations are considerable relative to the electrical wavelength they produce microphonic sensitivity, and this sensitivity increases as the wavelength shortens. For instance, microphonics can detune microwave circuits and such detuning is more sensitive to mechanical modulations of the electrical wavelength. The higher the frequency the more microphonic sensitive the microwave systems become.

Moreover, in wireless communication systems such as microwave radio, microphonics has some correlation with the modulation scheme and transmitted data rate. In systems with quadrature amplitude modulation (QAM), for example, as the modulation level increases and as the carrier recovery loop bandwidth narrows, the system becomes more susceptible to microphonics. Thus, conventional microwave radio systems using QAM may pass microphonic specification on 128 QAM, 75E1 but nevertheless fail the specification on 128QAM, 16DS1 (75E1 is a European transmission standard, ETSI, of 2.048 Mbits/sec×75; 16DS1 is a U.S. transmission standard, ANSI, of 1.544 Mbits/sec×16). It is more desirable to have microwave communication systems that satisfy the specifications of both standards, however.

Therefore, there is need to consider the potential for microphonic behavior in system design. One desired aspect of such system design might be to substantially reduce microphonic behavior and/or its effects.

SUMMARY

The present invention addresses these and related design aspects. In particular, the present invention contemplates system design for substantially eliminating microphonic behavior created by mechanical stimulus such as vibrations and the drum effect. A preferred approach includes isolating the motherboard (or IF control board) from its mounting harnesses (mechanical interconnection) and adding an echo damping and shock absorption pad to the underside of the enclosure cover to stiffen the enclosure cover while maintaining its light weight. Preferably also, this approach isolates the entire motherboard rather than a particular component. A design using this approach is particularly useful in an outdoor unit (ODU) of a split-mount microwave radio system.

This design provides a number of possible advantages. Among them is substantial elimination of microphonic behavior in systems that operate at very high frequencies, such as 38 GHz ODUs. This design requires fewer components, maintains simple structural cover design that requires less material and is lighter. Another advantage is broader array of product options, such as 128 QAM, 16DS1 data rate. This is a low cost solution for improving transmission performance associated with microphonics, for reducing signal degradation in high performance microwave radios with high data rate, and for extending high data rate transmission product options.

Accordingly, for the purpose of the invention as shown and broadly described herein the present invention is directed to a system and method for microphonic suppression. In accordance with one embodiment, an electronic system with a support structure for suppressing microphonics, comprises: an assembly that includes various functional subassemblies of an electronic system; an isolation component shaped to support the assembly and being operative to provide a soft mount for the assembly substantially in its entirety; and a standoff operatively coupled to the isolation component and shaped to provide mechanical support for the isolation component and assembly.

A variation of the microphonic suppression in such electronic system may include means for microphonics suppression of at least some of the subassemblies (e.g., oscillator, synthesizer) and an echo damping pad adhered to an underside of the cover. This implementation, although possible, is less advantageous, however.

In accordance with another embodiment, a method for suppressing microphonics in an assembly of an electronic system comprises: providing a support structure for an assembly that includes various functional subassemblies of an electronic system; resting the assembly on the support structure; and securing the assembly to the support structure. In this embodiment, the support structure includes an isolation component shaped to support the assembly and being operative to provide a soft mount for the assembly substantially in its entirety; and a standoff operatively coupled to the isolation component and shaped to provide mechanical support for the isolation component and assembly.

In accordance with another embodiment, a method for suppressing microphonics in an assembly of an electronic system comprises: providing the aforementioned support structure for an assembly that includes various functional subassemblies of an electronic system; mounting the isolation components on the standoffs; mounting the assembly on the support structure by fitting the assembly to the isolation components; and securing the assembly to the support structure.

In accordance with yet another embodiment, a method for suppressing microphonics in an assembly of an electronic system comprises: providing a base structure of an electronic system, the base structure being shaped to receive a support structure for an assembly that includes various functional subassemblies of the electronic system, the support structure being shaped to mechanically hold the assembly over the base and being operative to provide a soft mount for the assembly substantially in its entirety; anchoring in the base the support structure; mounting the assembly on the support structure by fitting the assembly to the isolation components; and securing the assembly to the support structure.

In these embodiments, various possible attributes may be present. The assembly may be for instance an IF (intermediate frequency) assembly of an IF control board enclosed by an electromagnetic shield, the IF control board including a printed circuit board for carrying the various functional subassemblies. Also, each of the various functional subassemblies may comprise a frequency synthesizer, an oscillator, a control circuitry, a modulator or a demodulator, and wherein the assembly includes at least two of these various functional subassemblies. The control circuitry may include a programmable device adapted for executing application program code, a field programmable device, an application specific integrated circuit, or any combination thereof.

Then, to provide the soft mount the isolation component is made of material is preferably capable of damping vibrations, shock isolation and cushioning while maintaining structural stability when compressed by the assembly. The material the isolation component is made of may be rubber, thermoplastic rubber, urethane, thermoplastic vinyl or viscoelastic compound. Structurally, in instance the standoff comprises a body and a stem, where the body is wider than the stem to create a shoulder on which the isolation component can rest. The stem may a threaded mounting hole extending partially or entirely through its length and adapted to receive a mounting screw for securing the isolation component and the assembly. Preferably, the mounting screw has an integrated washer. Typically, the electronic system will have a base structure. Thus, the standoff may further comprise an insert extending from one side of the body, wherein the base is adapted to receive and allow the insert to be firmly anchored therein. To this end, the insert may be threaded. Also, the body and stem of the standoff are made of a rigid material. Alternatively, the body and stem are made of a non-rigid material coated by a rigid material. The rigid material may be metal or plastic and the non-rigid material may be rubber, thermoplastic rubber, urethane, thermoplastic vinyl or viscoelastic compound.

In one configuration, the isolation component has an L-shaped vertical cross section. Accordingly, the isolation component may be a molded isolator resembling two stacked rings of different outer diameter and same inner diameter.

In another configuration, the isolation component and the standoff are one and the same structure and made of the same material. Again, to provide the soft mount the material is capable of damping vibrations, shock isolation and cushioning while maintaining structural stability when compressed by the assembly, wherein the material can be rubber, thermoplastic rubber, urethane, thermoplastic vinyl or viscoelastic compound. In this configuration, the structure has a body that is shaped to receive a mounting screw for securing the assembly thereto while providing the soft mount, wherein the body includes a threaded mounting hole the fits the mounting screw. The base of the electronic system is adapted to receive this structure, wherein the structure further includes an insert adapted for being anchored in the base.

One application for these support structures is in a wireless radio system, particularly one that operates in the microwave frequency range. Thus, the electronic system may be adapted as an outdoor unit of a split-mount wireless radio system.

This and other features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIGS. 5A through 5C illustrate a view from above and a cross-sectional view along line A-A of the system of FIG. 4 with the cover removed.

FIGS. 6A through 6C illustrate a top view and a cross-sectional view along line C-C of the system of FIG. 4 with the cover installed.

DETAILED DESCRIPTION

As mentioned, the present invention contemplates system design for substantially eliminating microphonic behavior created by mechanical stimulus such as vibrations and the drum effect. This design will preferably achieve the technical goal of noise suppression with a lightweight system which is easy to assemble and not costly to manufacture.

The preferred approach includes isolating the motherboard (or IF control board) from its mounting harnesses (mechanical interconnection) and adding an echo damping and shock absorption pad to the underside of the enclosure cover to stiffen the enclosure cover while maintaining its light weight. Preferably also, this approach substantially isolates the entire motherboard rather than a particular component. A design using this approach is particularly useful in an outdoor unit (ODU) of a split-mount microwave radio system.

This design approach has taken into consideration the beneficial aspects as well as deficiencies of various microphonics suppression designs. One such design separates the microphonics-susceptible synthesizers from the motherboard. Such design creates a synthesizer module mounted with vibration control materials separate from the motherboard. The synthesizer module requires additional DC and RF cables to connect it to the motherboard. Another design uses a wider loop bandwidth phase locked oscillator to suppress the microphonics, but it requires a very high Q resonator to meet phase noise requirement. Therefore the tuning range of the oscillator is limited. Yet another design uses a suppressed microphonic phase stable synthesizer, by combining numerous synthesizers with phase shift detectors and time delay devices to reduce microphonics. This may works for simple modulations but even then the implementation may be complex and expensive. Besides the synthesizer, components such as the reference oscillator, demodulator and modulator can be microphonics susceptible but, essentially, the foregoing designs suppress the microphonic behavior of separate components such as the synthesizers.

Thus, a preferred approach substantially isolates the entire module or motherboard from its mounting harnesses by soft-mounting the entire motherboard. In one embodiment this includes using rubber bushings to float (soft mount) the entire motherboard above metal standoffs and in another embodiment this includes using a rubber standoff on which to float the motherboard. Whichever configuration is used, soft mounting of the motherboard tends to suppress microphonic behavior of substantially all components on the board.

As to the drum effect, some designs use thicker cover material or a more rugged structure (e.g., ribs) to stiffen the cover. The added material increases weight and cost, however. A preferred approach uses therefore echo-damping material on the underside of the cover. This approach maintains low weight and low cost of the product and allows easy installation during initial manufacture or in the field.

Figure 1A:
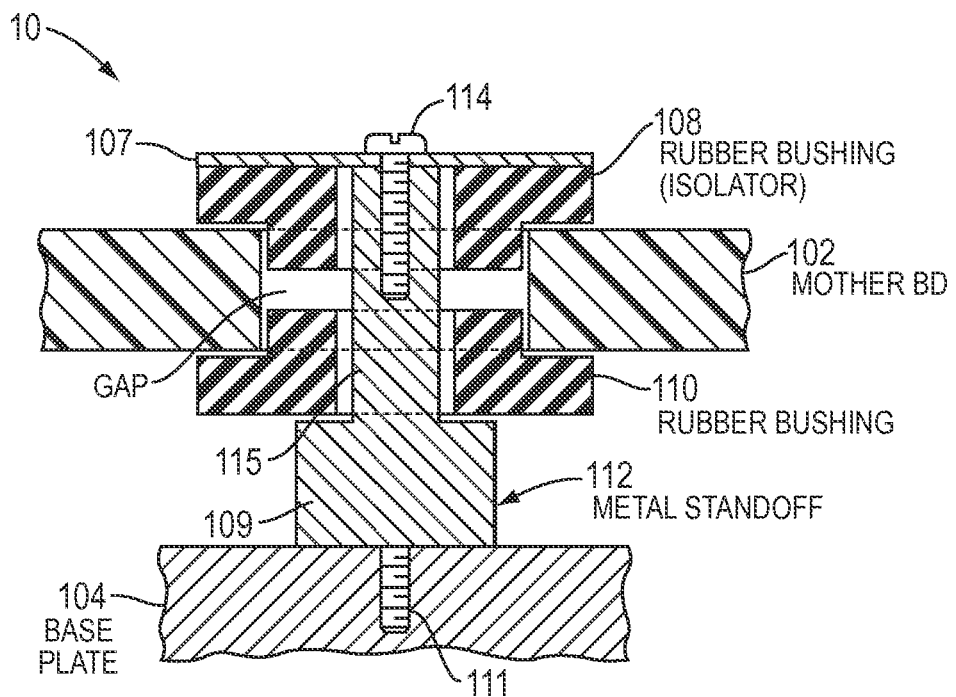
FIGS. 1A and 1B are conceptual illustrations of two possible system designs for suppressing microphonic behavior.
Figure 1B:
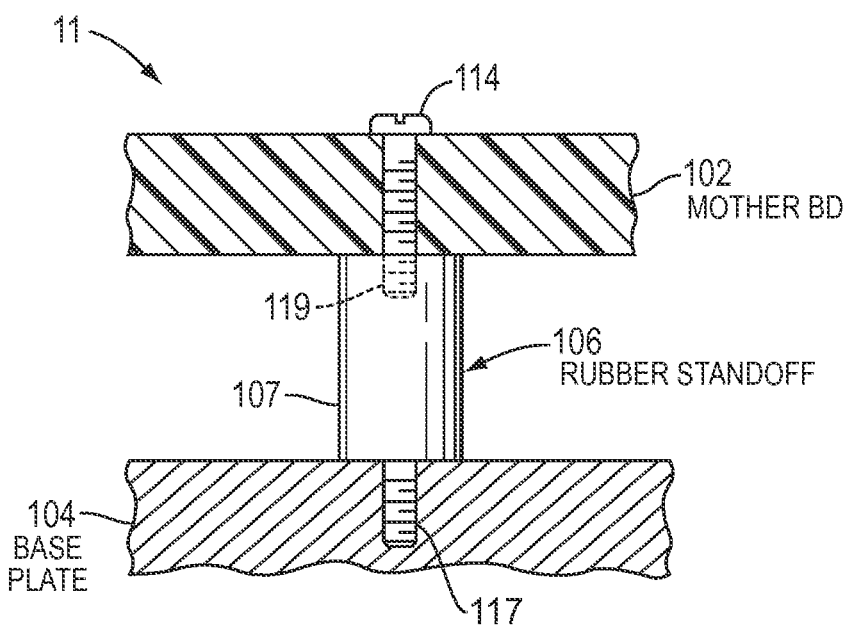

To illustrate various aspects of the present invention, FIGS. 1A and 1B are diagrams of two separate designs for suppressing microphonic behavior. In both designs, the motherboard 102 is mechanically attached to a base plate 104 via a mounting harness. For this purpose, the standoffs 112 and 106 provide the respective motherboard support and mechanical attachment to the base plate. In both instances the cross section of a standoff body can be of any suitable shape such as circle, ellipse, square, rectangle, hexagon or other.

In FIG. 1A, the standoff 112 is made of metal or any other material suitable for providing the support and attachment functionality, and in this embodiment the standoff is substantially rigid. The standoff 112 has a number of portions, including a body and insert and a stem. The stem 115 extends from the one end of the body and the insert 111, which may be threaded, extends from another end of the body. The base plate 104 is configured to receive the threaded insert 111, which is preferably anchored in the base plate first in order to secure the standoff 112. If the insert 111 is not threaded, it can be configured accordingly and forcefully fitted into the base plate to secure it in place. To secure other components, the stem 115 has a threaded mounting hole to allow insertion of a screw 114, where such hole can extend partially or the entire length of the stem. The body of the standoff 112 is wider than the stem, thus forming a shoulder on which a pair of rubber bushings (isolators) 110 can rest. A second pair of rubber bushings 108 rests (turned upside-down) on the motherboard 102, and all of these components, i.e., the motherboard 102, bushings 108, 110 and standoff 112, are secured to each other via the screw 114 and a washer 107. In this embodiment, the rubber bushings 110 and 108 are each shaped as a pair of stacked rings and because one of the rings has a smaller outer diameter the rubber bushings have an L-shaped vertical cross section. This shape allows the motherboard to be received and supported between two rubber bushings 108 and 110 that are installed facing each other. Thus, the entire assembly is held secured to the base plate 104 but the motherboard 102 is soft mounted between the rubber bushings 108 and 110.

In FIG. 1B, the body of the standoff 106 is made of rubber or other material with similar mechanical properties. The standoff 106 has a threaded insert 117 extending from one end of its body and a threaded mounting hole 119 at the other end. A stem is not needed in this configuration because the material from which the body of the standoff is made provides for the soft mounting. The base plate 104 is configured to receive the threaded insert 117, which, as before, is preferably anchored in the base plate first in order to secure the standoff 106. To secure other components, the threaded mounting hole 119 allows insertion of a screw 114, where such hole can extend partially or the entire length of the body. The threaded insert 117 and the lining of the threaded mounting hole 119 may be made of materials stiffer than rubber, e.g., metal, to maintain a stable connection between the base plate and the insert portion and between the threaded mounting hole and the screw, respectively. Instead of being made entirely of metal or other stiff material, the threaded insert 117 may be made of rubber coated with the stiffer material, provided the coating is sufficient to create the necessary rigidity for maintaining the stable connection with the base plate 104. The body of the standoff 109 is sufficiently wide to make room for the screw and to provide a supporting surface on which the motherboard 102 can rest.

Figure 2A:
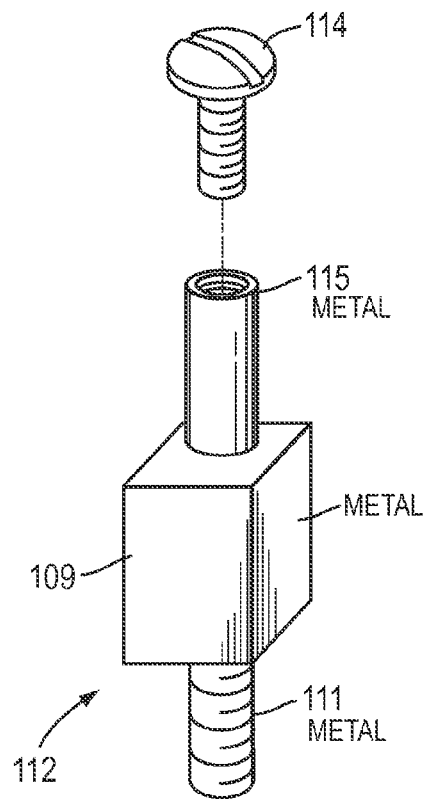
FIGS. 2A and 2B illustrate standoffs that can be respectively used in the two designs of FIGS. 1A and 1B.
Figure 2B:
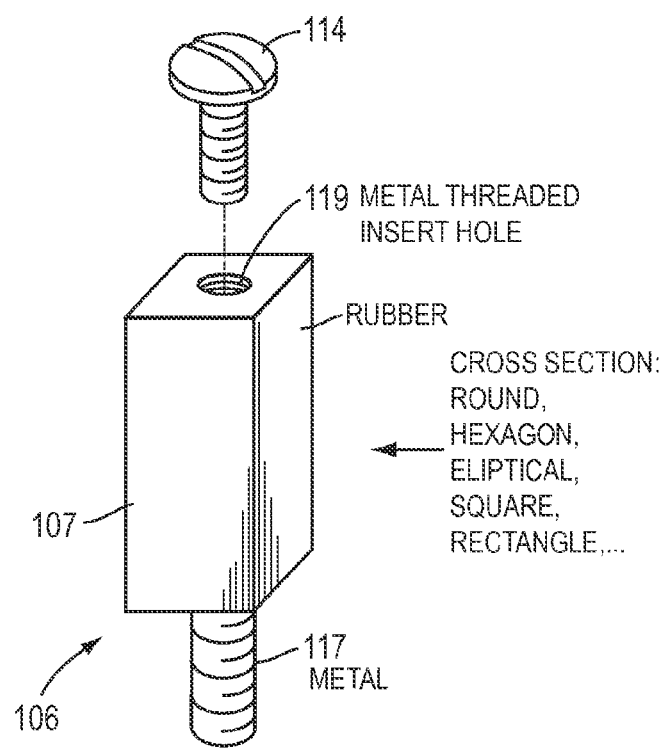
Figure 2C:
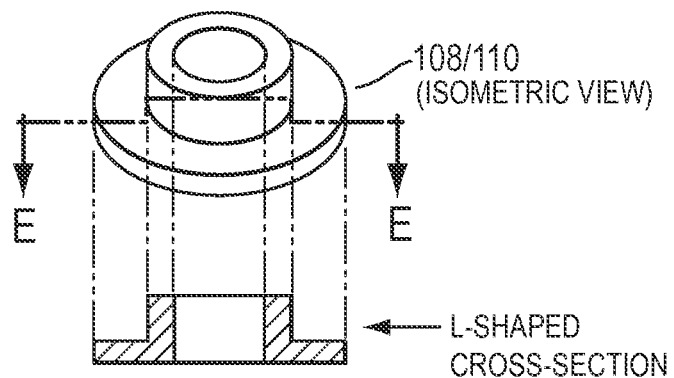
FIGS. 2C through 2E illustrate a possible shape of the rubber bushing (isolator) as used in the design of FIG. 1A.
Figure 2D:
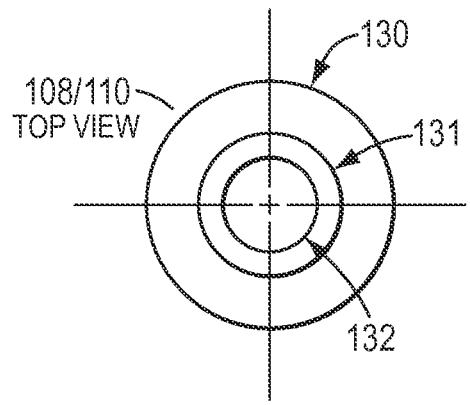
Figure 2E:
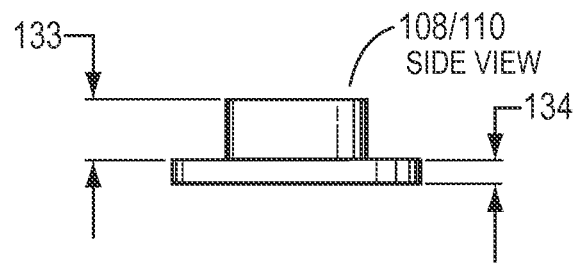

FIGS. 2A through 2E show the aforementioned components separately. For instance, FIG. 2A illustrates a metal body standoff 112 with the insert and stem portions and FIG. 2B illustrates the rubber body standoff 106 with the insert portion and the mounting hole. As can be appreciated, the various conceptual illustrations are not necessarily drawn to scale. In FIGS. 2C through 2E various views of the rubber bushings 108, 110 are provided, namely isometric (drawn face up) and cross section along line E-E in FIG. 2C, top view in FIG. 2D, and side view in FIG. 2E.

A design consideration for determining the thickness (height) 133, 134 of the rubber bushings may be that the isolation cannot interfere with the rigid mechanical connections while at the same time allowing the motherboard to 'float'. Also, the rubber bushings can be replaced with bushings made of any material that exhibits similar characteristics in the operating environment, e.g., over the operating temperature range. Preferably, the material from which the bushings are made should exhibit good damping performance, including for instance good vibration damping, shock isolation and cushioning, by compressing when absorbing impact energy.

For example, such material should be sufficiently soft to provide a soft-mount (cushion) support that yields to the weight of the motherboard when it vibrates and at the same time sufficiently firm to maintain structural stability and prevent yielding completely without leaving residual thickness when compressed by the motherboard. Structural stability will allow the material to retain it shape or substantially return to its original shape after it flexes or compresses. In one implementation the bushings can be molded isolators of E-A-R, Specialty Composites by Aearo Technologies, Indianapolis, Ind. These may include molded isolators made of thermoplastic vinyl, urethane elastomer, viscoelastic compound or thermoplastic rubber materials.

Figure 3:
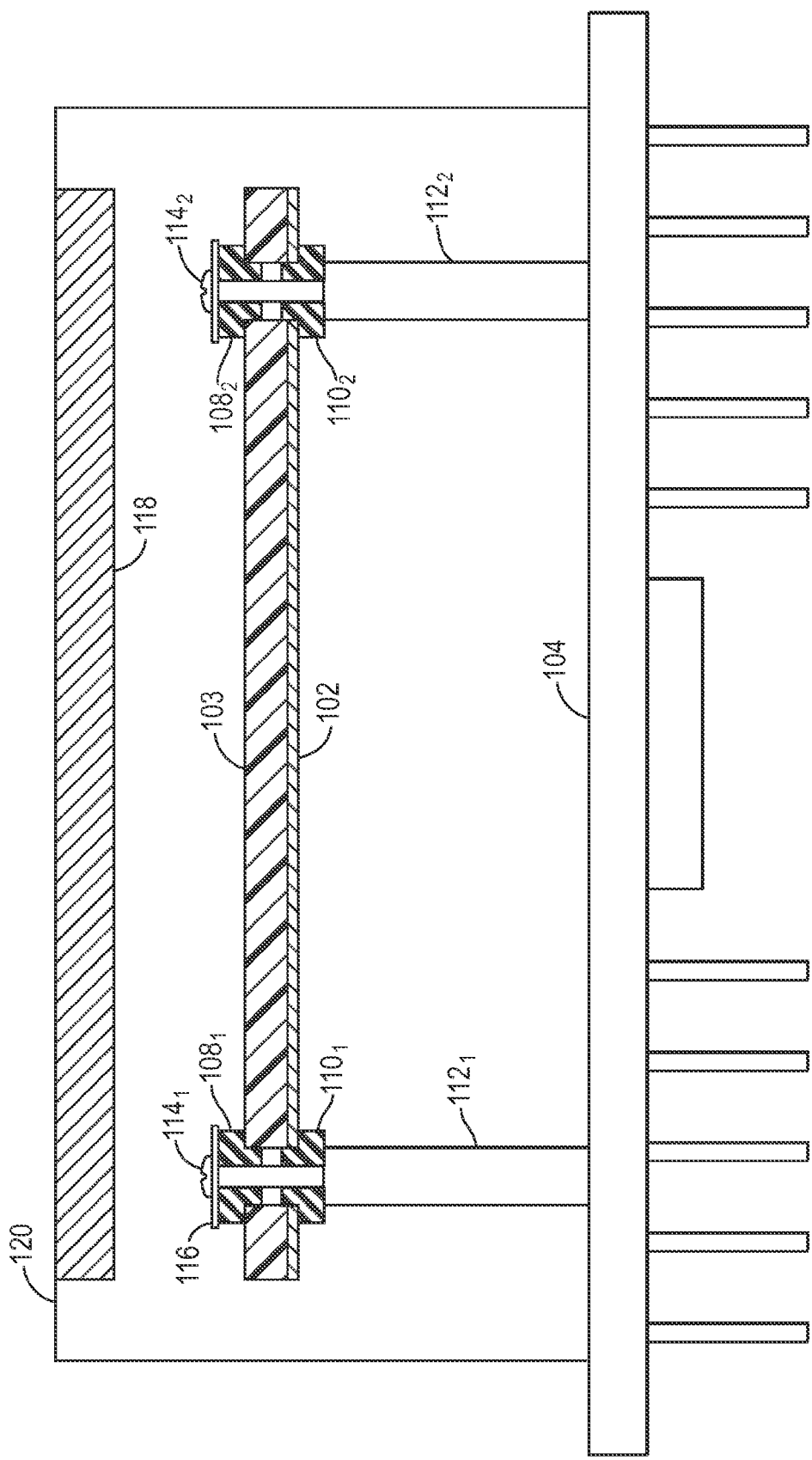
FIG. 3 is a conceptual illustration of a system design that combines microphonics and drum effect suppression.
Figure 4:
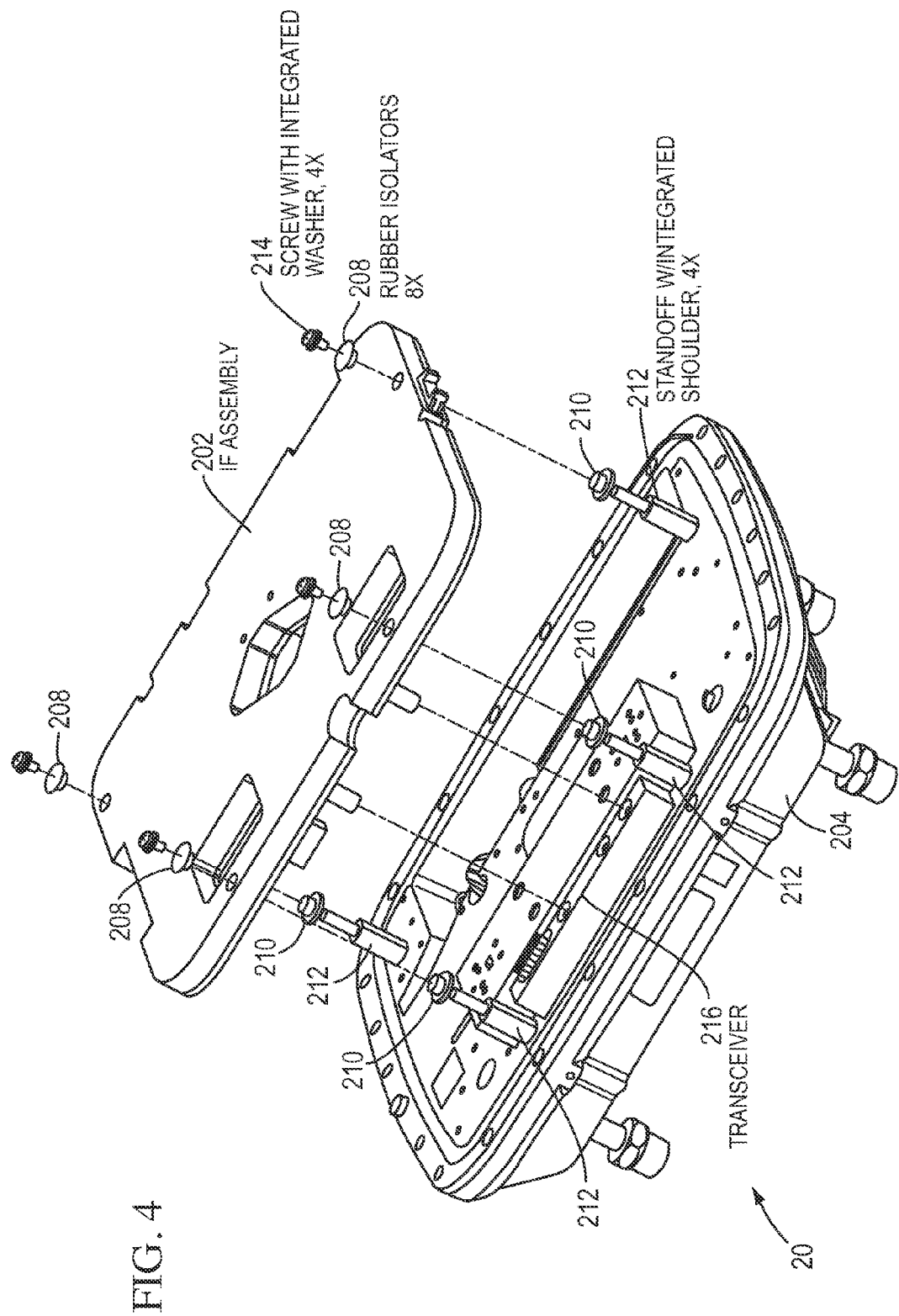
FIG. 4 illustrates an exploded isometric view of a system with a microphonic suppression feature according to an embodiment of the invention.

To improve microphonic suppression further design considerations are given to the drum effect. This design approach is applicable for instance in equipment that is covered to protect it from the elements or exterior environment. The drum effect results in such equipment when rain, hailstones or other elements pound on its cover and flex it creating pressure sound waves that propagate through the equipment from the vibrating cover. The thinner the metal cover material is the more ringing result from the pounding and, in turn, the worse drum effect. Thus, as shown in FIG. 3, the present invention contemplates attaching the aforementioned echo damping pad 118 to the underside of the cover 120.

The thickness and type of material from which the echo damping pad is made are designed to achieve substantial stiffness and fast vibration decay of the cover to which the pad is adhered. For example, the echo damping pad can be made of a self adhesive SoundampE asphalt based vibration damping sheet cut to size, which is offered by Acoustical Solutions, Inc. of Richmond, Va. For better results, such material is preferably designed to adhere to the underlying surface of the cover substantially without air pockets and without tendency to absorb moisture. Because of its relatively low weight and sufficient firmness, the echo damping pad adds little weight to the equipment and provides the necessary stiffness to limit or substantially eliminate the mechanical vibrations of the cover. As further shown, for a more complete solution, the echo damping pad 118 can be provided along with the aforementioned bushings 108 and 110 or with the rubber standoffs (106, not shown) for isolating the motherboard.

A practical application of the foregoing design approaches in an ODU portion of a split-mount microwave radio system is shown in FIGS. 4 through 6C. Specifically, in FIG. 4 the uncovered portion of the ODU 20 is shown with the IF assembly 202 secured to the base plate 204 via metal standoffs 212 and screws 214 with an integrated washer. The IF assembly 202 includes an IF control board, or motherboard, as we referred to it above, covered by an electromagnetic shield with ports for the waveguides. In this application, the IF assembly is soft mounted on rubber isolators 208 and 210 (similar to the bushings described in FIG. 1A and in FIGS. 2C through 2E). Incidentally, the standoffs 212 raise the IF assembly in order to mount it above other modules in the system such as the transceiver module 216.

Before the cover can be placed, the IF assembly is mounted on the base plate. Thus, FIG. 5A shows a top view of the uncovered ODU with the IF assembly 202 mounted on the base plate 204. FIG. 5B shows a vertical cross section view along line A-A of the uncovered ODU 22 with the IF assembly 202 mounted over the base plate 204. The microphonics suppression components (e.g., 208, 210, 212 and 214) are circled by 'B' and in FIG. 5C the circled components are shown in larger scale for clarity.

Then, the ODU with the mounted IF assembly can be covered as shown in FIGS. 6A through 6C. FIG. 6A shows a top view of the covered ODU 24 and FIG. 6B shows a vertical cross section along line C-C of the covered ODU. In this instance, both the motherboard isolation components (212 etc.) and the echo damping pad (218) are circled by 'D' and their details are shown in larger scale in FIG. 6C.

In sum, the present invention contemplates various design approaches to address microphonics behavior. Preferably, these include using components for soft-mounting the motherboard as well as using an echo damping pad with good damping performance. Finally, although the present invention has been described in considerable detail with reference to certain preferred versions thereof, other versions are possible. Therefore, the spirit and scope of the appended claims should not be limited to the description of the preferred versions contained herein.

What is claimed is:

1. A method for suppressing microphonics in an assembly of an electronic system, the method comprising:
providing a support structure for an assembly, the assembly including various functional subassemblies of an electronic system, the support structure including an isolation component and a standoff, the isolation component being shaped to support the assembly and being operative to provide a soft mount for the assembly, and the standoff being operatively coupled to the isolation component and being shaped to provide mechanical support for the isolation component and the assembly;
resting the assembly on the support structure; and
securing the assembly to the support structure.

2. The method of claim 1, wherein the providing the support structure for the assembly further comprises:
mounting the isolation component on the standoff; and
mounting the assembly on the support structure by fitting the assembly to the isolation component.

3. The method of claim 1, wherein the assembly is an IF (intermediate frequency) assembly of an IF control board enclosed by an electromagnetic shield, the IF control board including a printed circuit board for carrying the various functional subassemblies.

4. The method of claim 1, wherein each of the various functional subassemblies comprises a frequency synthesizer, an oscillator, a control circuitry, and a modulator or a demodulator, and the assembly includes at least two of the various functional subassemblies.

5. The method of claim 4, wherein the control circuitry comprises a programmable device adapted for executing application program code, a field programmable device, an application specific integrated circuit, or any combination thereof.

6. The method of claim 1, wherein to provide the soft mount the isolation component is made of material capable of damping vibrations, shock isolation and cushioning while maintaining structural stability when compressed by the assembly.

7. The method of claim 6, wherein the material the isolation component is made of is rubber, thermoplastic rubber, urethane, thermoplastic vinyl or viscoelastic compound.

8. The method of claim 1, wherein the standoff comprises a body and a stem, the body being wider than the stem to create a shoulder on which the isolation component can rest.

9. The method of claim 8, wherein the stem has a threaded mounting hole extending partially or entirely through its length and adapted to receive a mounting screw for securing the isolation component and the assembly.

10. The method of claim 9, wherein the mounting screw has an integrated washer.

11. The method of claim 8, wherein the body and stem of the standoff are made of a rigid material.

12. The method of claim 8, wherein the body and the stem are made of a non-rigid material coated by a rigid material.

13. The method of claim 12, wherein the rigid material is a metal or plastic and the non-rigid material is rubber, thermoplastic rubber, urethane, thermoplastic vinyl or viscoelastic compound.

14. The method of claim 1, wherein the isolation component has an L-shaped vertical cross section.

15. The method of claim 1, wherein the isolation component is a molded isolator resembling two stacked rings of different outer diameter and same inner diameter.

16. The method of claim 1, wherein the isolation component and the standoff are one and the same structure and made of the same material.

17. The method of claim 16, wherein to provide the soft mount the material is capable of damping vibrations, shock isolation and cushioning while maintaining structural stability when compressed by the assembly.

18. The method of claim 16, wherein the material is rubber, thermoplastic rubber, urethane, thermoplastic vinyl or viscoelastic compound.

19. The method of claim 16, wherein the structure has a body that is shaped to receive a mounting screw for securing the assembly thereto while providing the soft mount.

20. A system for suppressing microphonics in an assembly of an electronic system, the system comprising:

means for providing a support structure for an assembly, the assembly including various functional subassemblies of an electronic system, the support structure including an isolation component and a standoff, the isolation component being shaped to support the assembly and being operative to provide a soft mount for the assembly, and the standoff being operatively coupled to the isolation component and being shaped to provide mechanical support for the isolation component and the assembly;

means for resting the assembly on the support structure; and means for securing the assembly to the support structure.

* * * * *